US006700827B2

(12) United States Patent
Lien et al.

(10) Patent No.: US 6,700,827 B2
(45) Date of Patent: Mar. 2, 2004

(54) CAM CIRCUIT WITH ERROR CORRECTION

(75) Inventors: Chuen-Der Lien, Los Altos Hills, CA (US); Michael J. Miller, Saratoga, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 10/226,512

(22) Filed: Aug. 23, 2002

(65) Prior Publication Data

US 2003/0007408 A1 Jan. 9, 2003

Related U.S. Application Data

(63) Continuation-in-part of application No. 10/099,913, filed on Mar. 14, 2002, now Pat. No. 6,560,156, which is a continuation-in-part of application No. 09/781,524, filed on Feb. 8, 2001, now Pat. No. 6,563,754.

(51) Int. Cl.[7] .............................................. G11C 15/00
(52) U.S. Cl. ........................ 365/222; 365/49; 365/149
(58) Field of Search ......................... 365/49, 222, 149, 365/200

(56) References Cited

U.S. PATENT DOCUMENTS

| | | | |
|---|---|---|---|
| 3,665,422 A | 5/1972 | McCoy et al. | |
| 4,779,226 A | 10/1988 | Haraszti | |
| 4,791,606 A | 12/1988 | Threewitt et al. | |
| 4,991,136 A | * 2/1991 | Mihara | 365/49 |
| 5,184,325 A | 2/1993 | Lipovski | |
| 5,319,589 A | * 6/1994 | Yamagata et al. | 365/222 |
| 5,561,429 A | 10/1996 | Halberstam et al. | |
| 5,572,460 A | 11/1996 | Lien | |
| 5,642,320 A | 6/1997 | Jang | |
| 5,724,296 A | 3/1998 | Jang | |
| 5,796,671 A | 8/1998 | Wahlstrom | |
| 6,067,656 A | 5/2000 | Rusu et al. | |
| 6,421,265 B1 | 7/2002 | Lien et al. | |
| 6,430,073 B1 | 8/2002 | Batson et al. | |

OTHER PUBLICATIONS

F. Halsall, Data Communications, Computer Networks and OSI, 2d. ed., pp. 499–508, Addison–Wesley Publ. Co. (1988).

Application Note AN–94 "Error Detection and Correction with IDT49C466", released by Integrated Device Technology, Inc. (1996).

* cited by examiner

Primary Examiner—Huan Hoang
(74) Attorney, Agent, or Firm—Bever, Hoffman & Harms, LLP.

(57) ABSTRACT

A CAM circuit including a RAM array, a CAM array, a control/interface circuit, and an error detection and correction (EDC) circuit. The control/interface circuit systematically writes data from the RAM array to the CAM array, thereby preventing soft errors by continually refreshing data stored in the CAM array. The RAM array also stores check bits for each data word that can be generated by the EDC circuit when the data words are initially written to the CAM circuit. During the refresh operation, data words and associated check bits are read from the RAM array and transmitted to the EDC circuit. The EDC circuit analyzes each data word and associated check bits to detect errors, and corrects the data word, if necessary, before sending the data word to the CAM array.

20 Claims, 8 Drawing Sheets

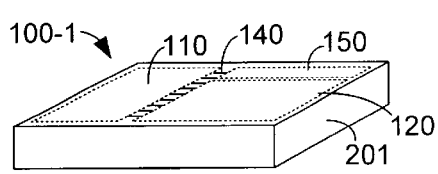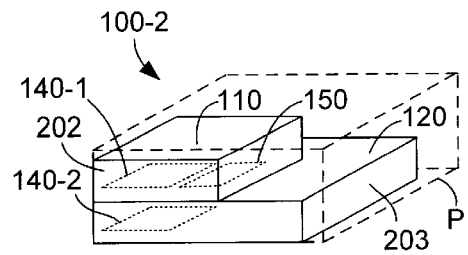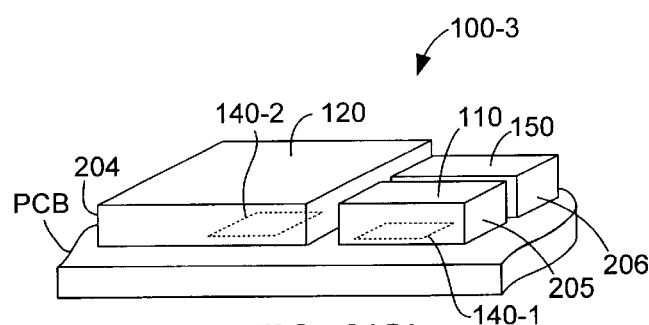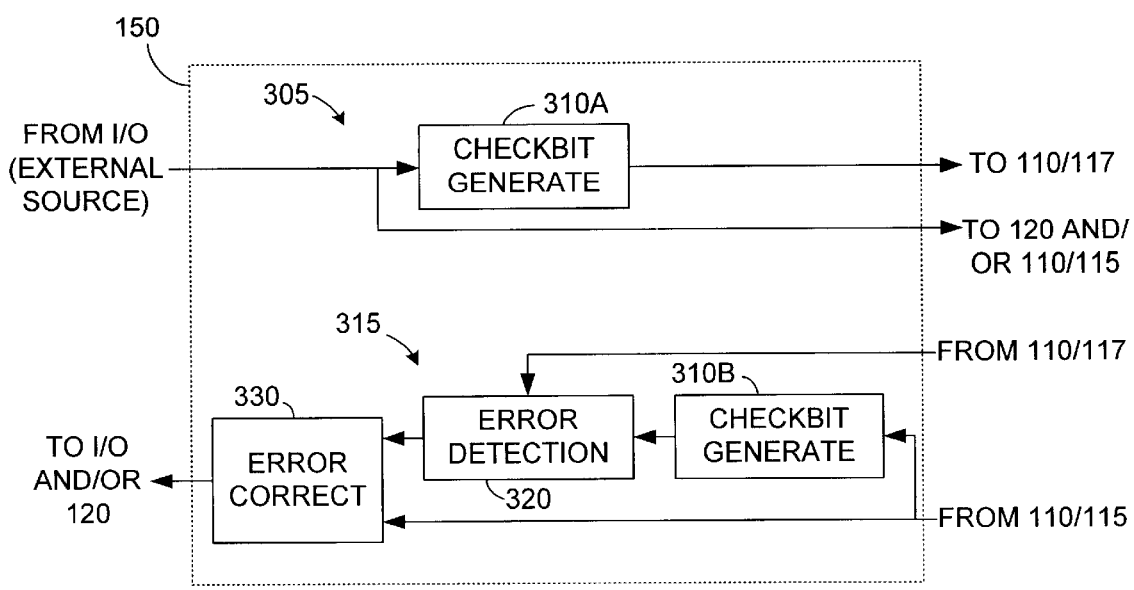

CAM CIRCUIT WITH ERROR CORRECTION

RELATED APPLICATIONS

The present application is a continuation-in-part of commonly owned U.S. patent application Ser. No. 10/099,913, "CAM CIRCUIT WITH RADIATION RESISTANCE" filed Mar. 14, 2002 by Chuen-Der Lien and Michael J. Miller, now U.S. Pat No. 6,560,156, which is a continuation-in-part of commonly owned U.S. patent application Ser. No. 09/781,524, "DRAM CIRCUIT WITH SEPARATE REFRESH MEMORY" filed Feb. 8, 2001 by Chuen-Der Lien and Chau-Chin Wu, now U.S. Pat. No. 6,563,754.

FIELD OF THE INVENTION

The present invention relates to integrated circuit memory devices, and in particular to content addressable memory (CAM) circuits.

DISCUSSION OF RELATED ART

Conventional random access memory (RAM) arrays include RAM cells (e.g., static RAM (SRAM) cells, dynamic RAM (DRAM) cells, and non-volatile RAM (NVRAM) cells) that are arranged in rows and columns, and addressing circuitry that accesses a selected row of RAM cells using address data corresponding to the physical address of the RAM cells within the RAM array. A data word is typically written into a RAM array by applying physical address signals to the RAM array input terminals to access a particular group of RAM cells, and applying data word signals to the RAM array input terminals that are written into the accessed group of RAM cells. During a subsequent read operation, the physical address of the group of RAM cells is applied to the RAM array input terminals, causing the RAM array to output the data word stored therein. Groups of data words are typically written to or read from the RAM array one word at a time. Because a relatively small portion of the entire RAM array circuitry is activated at one time to perform each data word read/write operation, a relatively small amount of switching noise within the RAM array, and the amount of power required to operate a RAM array is relatively small.

In contrast to RAM arrays, content addressable memory (CAM) arrays include memory cells (e.g., SRAM cells, DRAM cells, or NVRAM cells) in response to their content, rather than by a physical address. Specifically, a CAM array receives a data value that can be compared with all of the data words stored in the CAM array. In response to each unique data value applied to the CAM array input terminals, the rows of CAM cells within the CAM array assert or de-assert associated match signals indicating whether or not one or more data values stored in the CAM cell rows match the applied data value. Because large amounts of data can be searched at one time, CAM arrays are often much faster than RAM arrays in certain systems, such as search engines.

While CAM arrays are faster than RAM arrays in performing search functions, they consume significantly more power and generate significantly more switching noise than RAM arrays. In particular, in contrast to RAM arrays in which only a small portion of the total circuitry is accessed during each read and write operation, significantly more power is needed (and noise is generated) in a CAM array because a relatively large amount of circuitry is accessed during each lookup operation.

To reduce the total power consumed by CAM arrays, there is a trend toward producing CAM arrays that operate on low system voltages. To facilitate lower voltages, the integrated circuit (IC) fabrication technologies selected to produce such CAM arrays utilize smaller and smaller feature sizes. In general, the smaller the feature size of an IC, the lower the system voltage that is used to operate the IC. However, when IC feature sizes and system voltages are reduced too much, the amount of charge stored at each node within the CAM array becomes so small that a soft error problem arises, which is discussed below with reference to FIG. 12.

FIG. 12 is a simplified cross sectional view showing an N-type diffusion (node) 50 formed in P-type well (P-WELL) 51, which is exemplary of a typical IC feature (e.g., a drain junction utilized to form an N-type transistor). Dashed line capacitor 52 represents the capacitance of node 50, and indicates that node 50 stores a positive charge.

As indicated in FIG. 12, if an energetic particle, such as an alpha-particle ($\alpha$), from the environment or surrounding structure strikes the N-type diffusion of node 50, then electrons (e) and holes (h) will be generated within the underlying body of semiconductor material (i.e., in P-well 51). These free electrons and holes travel to the node 50 and P-well 51, respectively, thereby creating a short circuit current that reduces the charge stored at node 50. If the energy of the alpha-particle is sufficiently strong, or if the capacitance 52 is too small, then node 50 can be effectively discharged. When node 50 forms a drain in an SRAM cell and the charge perturbation is sufficiently large, the stored logic state of the SRAM cell may be reversed (e.g., the SRAM cell can be flipped from storing a logic "1" to a logic "0"). This is commonly referred to as a "soft error" because the error is not due to a hardware defect and the cell will operate normally thereafter (although it may contain erroneous data until rewritten).

Soft errors also arise due to other mechanisms, such as switching noise. As discussed above, switching noise is significantly higher in CAM arrays than in conventional RAM arrays, thereby making the problem of soft errors even greater in CAM arrays.

Erroneous data or loss of data integrity due to soft errors are major causes of system failure ("crash"). It is widely accepted that system failures and down time in electronic systems claim a heavy toll in terms of cost and performance of such systems. When a system crashes, unrecoverable data may be lost. Even in the best case, a user suffers a great deal of inconvenience. Hence, system designers are constantly trying to minimize the occurrence of soft errors in their systems in order to prevent costly system failures.

Many approaches have been proposed for dealing with soft errors, such as increased cell capacitance or operating voltage, and the use of error detection schemes (such as using parity bits or error checking and correcting (EDC) codes). While these proposed approaches are suitable for standard RAM arrays, they are less desirable in CAM arrays. As pointed out above, CAM arrays inherently consume more power than RAM arrays. Therefore, while increased cell size and/or operating voltage can be tolerated in a RAM array, such solutions are less desirable in a CAM arrays. Moreover, adding error detection schemes to CAM arrays increase the size (and, hence, the cost) of the CAM arrays, and further increase power consumption.

Accordingly, what is needed is a memory system that addresses the soft error problem associated with a CAM array of the system without greatly increasing the cost and power consumption of the CAM array.

SUMMARY

The present invention is directed to a CAM circuit including a CAM array, one or more RAM arrays, and control and interface circuits that coordinate the operation of the CAM array and RAM array(s) such that data stored in the CAM array is systematically refreshed using data stored in the RAM array(s). In addition, the CAM circuit includes an error detection or an error detection and correction (EDC; also known as error checking and correction, or ECC) circuit connected to the interface circuit for selectively performing error detection or EDC functions (e.g., detecting and, if necessary, correcting the data stored in the RAM array(s)) before writing the data to the CAM array. By providing separate RAM array(s) for refreshing the data values stored in the CAM array, and by performing the error detection or EDC functions on data words read from the RAM array(s) prior to being written to the CAM array, highly reliable CAM operations are provided without greatly increasing the cost and power consumption of the CAM array.

In one embodiment of the present invention, each data word written to the RAM array(s) includes an associated set of check bits, which are generated according to the Hammings single-bit code scheme, that can be utilized to detect and correct single bit errors in the data word, and detect (but not correct) some multiple bit errors in the data word. The check bits can be transmitted with the data bits when originally written to the CAM circuit. Alternatively, when only the data bits are written to the CAM circuit, the check bits may be generated by the EDC circuit when the data bits are first written to the RAM array(s), or generated when the data bits are first read from the RAM array(s). During subsequent refresh operations, the control circuit systematically refreshes selected CAM cells by reading the data word and associated (first) set of check bits from corresponding memory cells of the RAM array(s). The data bits and associated check bits are transmitted to the EDC circuit, which processes the data bits and check bits to detect and, if possible, correct data bit errors. In one embodiment, the error detection process involves generating a new (second) set of check bits using the data bits (i.e., as read from the RAM array), and comparing the new check bits with the previously stored (first) set of check bits. In another embodiment, the data bits and associated check bits are converted into binary numbers that are added together using modulo 2 arithmetic to identify erroneous bit values. When an error is detected in the data bits (e.g., when the previously stored check bits fail to match the new check bits, or when the sum of the modulo 2 arithmetic operation is non-zero), the data word is corrected according to known techniques (e.g., correcting a bit identified by the modulo 2 arithmetic operation), and the corrected data word is then passed to a write register for transmission to the CAM array. In some embodiments, the data word and check bits are also re-written to the RAM array(s).

In another embodiment of the present invention, data is encoded, for example, using a convolution code before being stored in the RAM array(s). In such embodiments, the encoded data is processed by the EDC circuit in a manner that involves decoding the encoded data, detecting errors in the decoded data, correcting the detected errors according to known techniques.

In yet another embodiment of the present invention, an automatic repeat request (ARQ) error control scheme is utilized in which, when an error is detected, the refresh operation is temporarily halted, and a request for a copy of the data word is generated and transmitted from the CAM circuit to an external control circuit (e.g., a computer). The external control circuit then responds to the request by transmitting the data word copy to the CAM circuit. The data word copy then replaces the erroneous data word, and the refresh operation is resumed.

In accordance with an aspect of the present invention, during data read operations, data words are only read from the RAM array(s) (i.e., not from the CAM array). In one embodiment, both the data bits and associated check bits are read from the RAM array(s), and the error detection or EDC function is performed before the data word is passed to a read register for transfer from the CAM circuit. In another embodiment, fast read operations are facilitated by passing the data bits read from the RAM array(s) directly to the read register (i.e., without performing the error detection or EDC function). By reading data bits only from the RAM array(s) (i.e., not from the CAM array), operation of the CAM circuit is greatly simplified.

The present invention will be more fully understood in view of the following description and drawings.

BRIEF DESCRIPTION OF THE DRAWINGS

FIGS. 2(A), 2(B) and 2(C) are perspective views depicting the CAM circuit of FIG. 2 according to various embodiments of the present invention;

FIG. 3 is a simplified block diagram showing an EDC circuit utilized in the CAM circuit of FIG. 1 according to an embodiment of the present invention;

DETAILED DESCRIPTION

Figure 1:
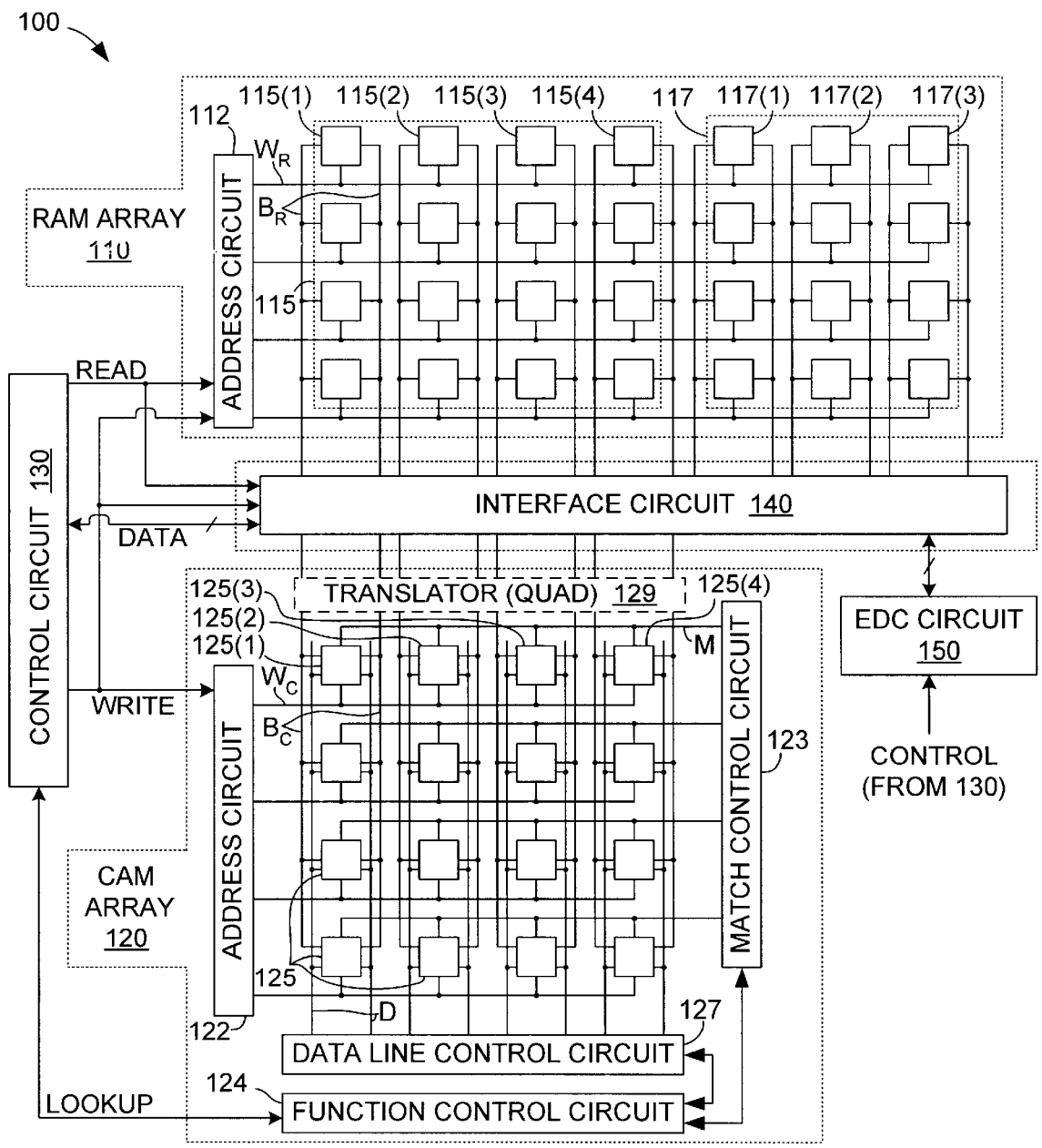
FIG. 1 is a block diagram showing a simplified CAM circuit in accordance with the present invention.

FIG. 1 is a block diagram showing a CAM (memory) device 100 in accordance with a simplified embodiment of the present invention. CAM device 100 generally includes a RAM array 110, a CAM array 120, a control circuit 130, an interface circuit 140, and an error detection and correction (EDC) circuit 150. Each of these circuits is discussed in additional detail below.

Referring to the upper portion of FIG. 1, RAM array 110 includes a first group of memory cells 115 and a second group of memory cells 117 that are arranged in rows and columns. Each row of memory cells 115 and 117 is connected to an associated write line $W_R$, and is addressed during read and write operations by an address signal transmitted from address circuit 112 in accordance with known techniques. Each column of memory cells 115 and 117 is connected to one or more associated bit lines $B_R$, which are used to transmit data values to and from interface circuit 140 in the manner described below. As discussed in additional detail below, each memory cell 115 and memory cell 117 can be an SRAM cell, a DRAM cell, or a non-volatile memory cell (e.g., an EEPROM).

In accordance with an embodiment of the present invention, each row of memory cells 115 stores a data word (data bits), and each row of memory cells 117 stores a checkbit word (check bits) that is an encrypted form of the data word stored in that row. For example, referring to FIG. 1, memory cells 115(1) through 115(4) store a first data word, and memory cells 117(1) through 117(3) store a first checkbit word that is associated with the first data word stored in memory cells 115(1) through 115(4). As discussed in additional detail below, the checkbit word is an encrypted form of the associated data word that facilitates the detection of multi-bit errors in the associated data word, and the correction of single bit errors in the associated data word. In one embodiment in which a modified Hamming code is used to correct single bit errors, when the number of memory cells 115 associated with each data word (i.e., row) is $2^n$ (e.g., 64), the number of memory cells 117 used to store the associated checkbit word is n+1 (e.g., eight). One or more additional memory cells 117 may be used as status flags in the manner described below.

CAM array 120 includes CAM cells 125 that are also arranged in rows and columns. Each row of CAM cells 125 is connected to an address circuit 122 by an associated write line $W_c$, and is addressed during write operations by an address signal transmitted from address circuit 127 in accordance with known techniques. Each row of RAM cells 125 is also connected to a match line control circuit 123 by an associated match line M, which is controlled by a function circuit 124 during lookup and write operations (described below). Each column of CAM cells 125 is coupled to interface circuit 140 by one or more associated bit lines $B_c$, which are used to transmit data values from interface circuit 140 to rows of memory cells addressed by address circuit 122. An optional translator circuit 129 is connected between bit lines $B_c$ and interface circuit 140 when CAM array 120 implements quad (four state) CAM functions (translator circuit 129 is described in additional detail below). In addition, each column of CAM cells 125 is connected to a data line control circuit 127 via one or more associated data lines D, which is controlled by function control circuit 124 and used to transmit data values to CAM cells 125 during lookup operations.

In accordance with another aspect of the present invention, each CAM cell 125 of CAM array 120 is associated with one or more memory cells 115 of RAM array 110. In one embodiment, each CAM cell 125 includes only one memory cell (e.g., CAM array 110 is a binary CAM array), and RAM array 110 includes one memory cell 115 (plus associated memory cells 117) for each CAM cell 125. For example, a CAM array 120 including 9 Megabytes of binary CAM cells 125 is combined with a RAM array 110 including 9 Megabytes of memory cells 115 to produce a binary CAM device 100. In contrast, when each CAM cell 125 includes more than one memory cell (e.g., when CAM array 110 is a ternary or quad CAM array), then one or more RAM arrays 110 include two memory cells 115 for each CAM cell 125. For example, a CAM array 120 including 9 Megabytes of ternary or quad CAM cells 125 is combined with a RAM array 110 having 18 Megabytes of memory cells 115 (or two RAM arrays 110, each having 9 Megabytes of memory cells 115). Similarly, memory cells 117 may be combined with memory cells 115 on a single RAM device 110, or may be provided on a separate RAM device.

Referring to the left side of FIG. 1, control circuit 130 is coupled to RAM array 110, CAM array 120, interface circuit 140, and EDC circuit 150, and controls these circuits during the operation of CAM device 100. In particular, control circuit 130 transmits control and address signals to these circuits, and coordinates data transmissions to and from these circuits during read, write, and lookup operations in the manner described in detail below. In one embodiment control circuit 130 is implemented by a microprocessor, ASIC, or programmable logic device (PLD) that is fabricated on a separate substrate (e.g., silicon chip) and connected by suitable conductive paths to RAM array 110, CAM array 120, and interface circuit 140. In another embodiment, control circuit 130 is implemented by logic circuitry integrally formed on the same substrate with RAM array 110, CAM array 120, and/or interface circuit 140.

Interface 140 is provided to store (register) data words transmitted between RAM array 110, CAM array 120, control circuit 130, and EDC circuit 150. Interface circuit 140 can either be a single circuit connected between RAM array 110 and CAM array 120, or separated into one or more components that are connected, for example, by a bus. For example, FIG. 2(A) shows a CAM system 100-1 in which RAM array 110 and CAM array 120 are integrated on a single substrate (i.e., simultaneously fabricated on substrate 201). In this embodiment, interface circuit 140 can be a single circuit linking the two arrays. However, as shown in FIGS. 2(B) and 2(C), interface circuit 140 may comprise two or more sections when RAM array 110 and CAM array 120 are fabricated on separate substrates. For example, FIG. 2(B) shows a CAM device 100-2 in which RAM array 110 and CAM array 120 are fabricated on substrates 202 and 203, respectively, and include interface circuit portions 140-1 and 140-2, respectively. Note that RAM array 110 and CAM array 120 are mounted in a single package P, and are connected using a "flip-chip" arrangement. FIG. 2(C) shows another embodiment in which a CAM device 100-3 includes RAM array 110 and CAM array 120 fabricated on substrates 204 and 205, respectively, and mounted on a printed circuit board (PCB) including conductive traces that form a bus facilitating communication between interface circuits 140-1 and 140-2, which include conventional input/output (I/O) circuitry. The examples shown in FIGS. 2(A) through 2(C) are intended to be exemplary, and not limiting. For example, although RAM array 110 and EDC circuit 150 are shown as being formed on a single substrate, these devices may be formed on two, three, or more separately fabricated integrated circuit chips.

The alternative embodiments shown in FIGS. 2(A) through 2(C) establish that CAM devices according to the present invention may be formed integrally, or as separate devices that are linked, for example, using a bus. While forming both RAM array 110 and CAM array 120 on a single substrate facilitates a smaller circuit, several advantages are provided when RAM array 110 and CAM array 120 are fabricated on separate substrates (e.g., as shown in FIGS. 2(B) and 2(C)). For example, due to their relatively low switching noise and power consumption, fabricating RAM arrays on separate substrates allows the use of relatively high system voltages to avoid soft errors, while the separate CAM arrays can be formed using relatively low system voltages.

FIG. 3 is a simplified block diagram showing EDC circuit 150 according to an embodiment of the present invention. EDC circuit 150 includes a first (write) path 305 and a read path 315. During write operations, a data word transmitted from an external source is encrypted by a checkbit generation circuit 310A to generate an associated checkbit word. In one embodiment, this encryption process is performed using a modified Hamming code according to Application Note AN-94 "Error Detection and Correction with IDT49C466", released by Integrated Device Technology, Inc. (1996). As indicated by write path 305, the originally submitted data word is passed to associated memory cells 115 of RAM array 110, and the associated checkbit word generated by checkbit generation circuit 310A is passed to associated memory cells 117 of RAM array 110. In addition, according to one embodiment, the data value may be immediately written to CAM array 120. Read path 315 utilizes a checkbit generation circuit 310B (which may utilize some or all of checkbit generation circuit 310A), an error detection circuit 320, and an error correction circuit 330 to detect and correct single bit errors in data words read from RAM 110. During a read or refresh operation, both a data word and its associated checkbit word are read from memory cells 115 and 117, respectively. The data word is passed to checkbit generation circuit 310B, which then generates a new checkbit word that is then passed to error detection circuit 320. Error detection circuit compares the stored checkbit word read from memory cells 117 with the new checkbit word generated by checkbit generation circuit 310B, and generates a coded error message according to known techniques that is passed to error correction circuit 330. Error correction circuit 330 then utilizes this coded error message to correct, if necessary the data word read from memory cells 115, and then passes the data word to interface circuit 140 for writing to one or more of the I/O register, CAM array 120, and RAM array 110. In other embodiments, EDC circuit 150 may be implemented using any of several conventional EDC circuit types.

Operation of CAM circuit 100 will now be described with reference to FIG. 1.

In accordance with one embodiment, during write operations, data words transmitted to CAM circuit 100 are passed to EDC circuit 150 prior to being written to RAM array 110 and CAM array 120. In particular, control circuit 130 generates an appropriate write command signals and associated address signals (WRITE) that are transmitted to RAM array 110, CAM array 120, interface circuit 140, and EDC circuit 150 such that each data word is transmitted through interface circuit 140 to EDC circuit 150. As described above, EDC circuit 150 generates a checkbit word based on the data word, and then passes both the checkbit word and the data word back to interface circuit 140. Next, control circuit 130 generates appropriate write command signals and associated address signals (WRITE) that are transmitted to RAM array 110, CAM array 120, and interface circuit 140 such that the data word is stored in corresponding memory cells 115 of RAM array 110 and memory cells 125 of CAM array 120, and such that the checkbit word is stored in associated memory cells 117 of RAM array 110. For example, assuming memory cell 115(1) is associated with a binary CAM cell 125(1), then one data value of a data word is written to both memory cell 115(1) and to CAM cell 125(1). Similarly, one check bit of the checkbit word associated with the data word is written to memory cell 117(1). In one embodiment, RAM array 110 and CAM array 120 are arranged such that an address generated by control circuit 130 accesses the associated cells in both arrays. For example, if an address value "00" transmitted from control circuit 130 to address circuit 112 of RAM array 110 addresses the row containing memory cells 115(1), then the same address value "00" transmitted to address circuit 122 of CAM array 120 addresses the row containing CAM cell 125(1). Accordingly, a data word "1000" written to address "00" of both RAM array 110 and CAM array 120 will result in a logic "1" being stored in both memory cell 115(1) and binary CAM cell 125(1). In other embodiments, an address conversion may be utilized in one of RAM array 110 and CAM array 120 to simultaneously address both associated RAM and CAM cells. In one embodiment, the particular row of RAM cells 115/117 and CAM cells 125 addressed during the write operation is controlled by a counter provided in address circuits 112 and 122, respectively. In another embodiment, write operations are performed by writing new data values only to RAM array 110, which then writes the new data values to CAM array 120 during a refresh operation (discussed below).

Note that the checkbit word associated with each data word written to CAM array 120 and/or RAM array 110 may either be generated during the writing process, as described above, or may be delayed until a subsequent read/refresh operation. When check bits generation is delayed, one bit of the checkbit word associated with each data word (e.g., one memory cell 117 in each row) may be designated as a flag that is set when the associated data word is written to RAM array 110. This flag indicates that the currently stored checkbit word for that data word must be updated, and causes interface circuit 140 and EDC circuit 150 to update that checkbit word during a subsequent read/refresh operation involving the data word.

When CAM device 100 receives a lookup (search) instruction, control circuit 130 transmits a lookup command (LOOKUP) to CAM array 120 that includes the data value sought and, in some cases, a range of addresses to be searched. In particular, this information is transmitted to function control circuit 124, which controls match line control circuit 123 and data line control circuit 127 such that the sought-for data value is applied to data lines D, and lookup (match) results are transmitted from match control circuit 123 via function control circuit 124 to control circuit 130. The operation of each CAM cell 125 during lookup operations is described below.

In accordance with another aspect of the present invention, command circuit 130 systematically refreshes CAM array 120 using corresponding data values read from RAM array 110. Each refresh operation involves reading a data word stored in memory cells 115 and the associated checkbit word stored in memory cells 117 of RAM array 110, performing an EDC function to detect/correct the data word, and then writing the data word to one or more corresponding CAM cells 125 in CAM array 120. For example, referring to FIG. 1, a data word read from RAM cells 115(1) through 115(4) is checked/corrected using a checkbit word read from RAM cells 117(1) through 117(3), and then the checked/corrected data word is written to associated CAM cells 125(1) through 125(4). In one embodiment, a first row of memory cells 115/117 is read, check/corrected, and then written to a corresponding first row of CAM cells 125, then a second row, and so on, until all data values stored in CAM array 120 are refreshed. The process of sequentially refreshing selected rows CAM array 120 is referred to herein as a refresh operation or refresh cycle. The term "systematically" is used herein to indicate that each refresh operation is either performed according to a predetermined schedule, or is performed in response to a predetermined event. For example, in one embodiment the refresh operation is continuously performed such that, upon completing one refresh cycle, a new refresh cycle is immediately initiated, thereby refreshing CAM array 120 as often as possible to minimize the chance of a soft error resulting in an erroneous lookup operation. In another embodiment, a fixed time delay may be inserted between each refresh operation (e.g., to allow for read or write operations, if necessary). In yet another embodiment, the refresh operation may be initiated before each lookup operation. Refresh operations are described in additional detail below with reference to the specific embodiments.

By systematically refreshing CAM array 120 using data read from RAM array 110, soft errors caused, for example, by alpha particles striking the memory cells of CAM array 120 are essentially eliminated because the resulting erroneous data values are immediately corrected during the next refresh operation. Further, when CAM array 120 and RAM array 110 are formed on separate devices, because the present invention avoids the need to incorporate a soft error prevention scheme into CAM array 120, the cost of fabricating separate CAM array 120 is reduced (i.e., as compared to providing EDC circuitry directly onto a CAM device).

In accordance with another aspect of the present invention, when CAM device 100 receives a read instruction, control circuit 130 transmits a read command (READ) signal only to RAM array 110, which includes an address (or address range) of the data word (or words) to be read. In conventional CAM devices, data must be read from the CAM array, which requires that the CAM array include specific circuitry that supports such read operations. Because the data values stored in RAM array 110 are essentially identical to those stored in CAM array 120, read operations are performed by reading data values from RAM array 110, thereby allowing CAM array 120 to exclude specific circuitry needed to support read operations. Note that the EDC function may be performed during the read operation, or may be omitted for purposes of increasing read operation speed.

As set forth in the following examples, CAM circuits of the present invention can be formed using any CAM array type, or utilizing any combination of memory technologies.

Figure 4:
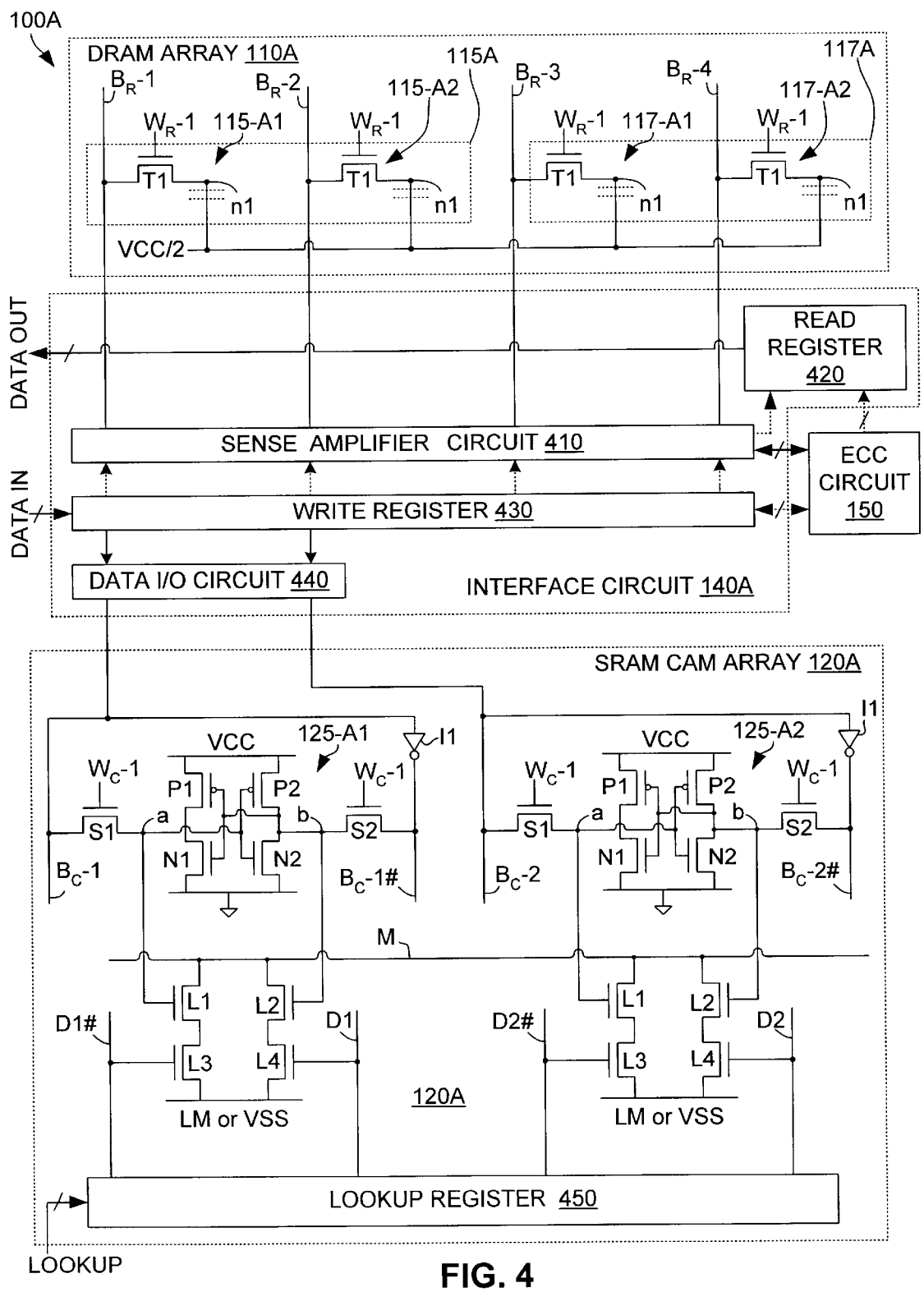
FIG. 4 is a simplified schematic diagram showing a portion of a binary CAM device according to a first specific embodiment of the present invention.

FIG. 4 is a simplified circuit diagram showing portions of a binary CAM device 100A in accordance with a first specific embodiment of the present invention. Consistent with generalized CAM device 100 (shown in FIG. 1), CAM device 100A includes a DRAM RAM array (device) 110A, an SRAM CAM array (device) 120A, and EDC circuit 150 (previously discussed) that are connected by interface circuit 140A. Portions of CAM device 100A that are not required for explanatory purposes are omitted for brevity.

Referring to the upper portion of FIG. 4, DRAM array 110A includes a first DRAM group 115A including conventional DRAM cells 115-A1, 115-A2, and a second DRAM group 117A including conventional DRAM cells 117-A1 and 117-A2. In the present embodiment, DRAM cells 115-A1, 115-A2, 117-A1, and 117-A2 form part of one row of DRAM array 110A. Each DRAM memory cell (e.g., DRAM cell 115-A1) includes a transistor T1 having a gate terminal connected to an associated word line (e.g., word line $W_R$-1), which is controlled by address circuit 112 (see FIG. 1), a first terminal connected to an associated bit line (e.g., bit line $B_R$-1), and a second terminal connected to a signal source (e.g., VCC/2 or ground). Data values written to each DRAM memory cell are stored at a storage node n1, which includes a capacitor (indicated by dashed parallel plates) that is formed between the second terminal of transistor T1 and the signal source for temporarily storing the data value according to known DRAM techniques.

Referring to the central portion of FIG. 4, interface circuit 140A includes a sense amplifier circuit 410 that is connected to the bit lines (e.g., $B_R$-1 through $B_R$-4) of DRAM array 110A, a read register 420, a write register 430, and an optional data input/output (I/O) circuit 440 (note that a portion of data I/O circuit 440 may also provided on SRAM CAM array 120A).

Sense amplifier circuit 410 senses the data values stored at node n1 of each DRAM memory cell 115-A1, 115-A2, 117-A1, and 117-A2 during a read operation and during the read phase of a refresh operation in accordance with known techniques. Sense amplifier circuit 410 then amplifies the sensed data values (e.g., to VCC when a logic "1" is detected, or ground/zero volts when a logic "0" is detected), and passes the amplified data values to read register 420 and/or EDC circuit 150, depending on the operation being performed, and depending on the particular embodiment implemented by interface circuit 140A. In one embodiment, as indicated by the dashed arrow passing from sense amplifier circuit 410 to read register 420, data read operations are performed by directly passing a data word read from DRAM array 110A (e.g., from DRAM cells 115-A1 and 115-A2) from sense amplifier to read register 420 (i.e., not passed through EDC circuit 150) to facilitate fast read operations. Conversely, in another embodiment where read operation speed is less important, data values read from DRAM array 110A are checked/corrected by EDC circuit 150 before being passed to read register 420. Data values passed to read register 420 are output to control circuit 130 (see FIG. 1) for transmission out of CAM circuit 110A.

Write register 430 is a second data register utilized during write operations, or during the write portion of a refresh operation. New data values are passed to write register 430 from control circuit 130 (see FIG. 1) during write operations. In one embodiment, as indicated by the dashed arrow passing from write register 430 to sense amplifier circuit 410, a newly written data word is passed directly from write register 430 to sense amplifier circuit 410 (i.e., not passed through EDC circuit 150). In another embodiment, data words written to CAM circuit 100A are encrypted by EDC circuit 150, and the data words and associated checkbit words are then passed to DRAM array 110A and CAM cell 120A in the manner described above. During the write portion of a refresh operation, the data words and associated checkbit words are read from DRAM array 110A, checked/corrected by EDC circuit 150 in the manner described above, and then the data word is passed to write register 430 for transmission to DRAM array 110A and CAM cell 120A.

Referring to the lower portion of FIG. 4, SRAM-based CAM array 120A includes an array of SRAM CAM cells 125A (one shown) that are arranged in rows and columns. Each binary CAM cell 125A that includes a bistable flipflop formed by transistors P1, P2, N1, and N2 that is connected by access transistors S1 and S2 to complementary bit lines B and B# (the symbol "#" is used herein to designate complement), and includes a logic (lookup) circuit formed by transistors L1 through L4. The bistable flipflop formed by transistors P1, P2, N1 and N2 stores a data value (bit) according to known techniques. Access transistors S1 and S2 pass data values from bit lines B and B# to the bistable flipflop circuit during write and refresh operations, and the logic circuit formed by transistors L1 through L4 is utilized during lookup (search) operations, as described below.

During a data write operation, a data value to be stored is written to storage nodes a and b by applying a true (e.g., logic "1" or VCC) data signal and a complement (e.g., logic "0" or ground) data signal to bit lines B and B#, respectively, and then applying a high voltage signal on word line W. The high voltage on word line W turns on access transistors S1 and S2, thereby passing the data signals to storage nodes a and b. The high voltage at node a turns on transistor N2, thereby connecting node b to ground. Similarly, the low voltage at node b turns on transistor P1, thereby connecting node a to VCC. The bistable flipflop circuit formed by transistors P1, P2, N1 and N2 remains latched in this state until an opposite data value is written to storage nodes a and b (e.g., by applying a logic "0" or ground to node a, and a logic "1" or VCC to node b).

Subsequent to storing a data value in DPAM CAM cell 125A, a lookup (search) operation is performed by precharging match line M and transmitting a data value to be compared via a lookup register 450 onto data line D, and the complement of the data value onto inverted data line D#. Note that data lines D and D# may be shared with bit lines B# and B, respectively, but shared arrangement prevents simultaneous lookup and read/write operations. A no-match condition is detected when match line M is discharged to ground through the signal path formed by transistors L1 and L3, or through the signal path formed by transistors L2 and L4. Specifically, when a logic "1"is stored in the bistable flipflop circuit (i.e., a high voltage is stored at node a) and a logic "0" is applied as the compare data value (i.e., a high voltage is transmitted on inverted data line D#), then both transistors L3 and Q4 are turned on to discharge match line M to ground. When a logic "0" is stored in the bistable flipflop circuit (i.e., a high voltage is stored at node b) and a logic "1" is applied as the compare data value (i.e., a high voltage is transmitted on data line D), then both transistors L2 and L4 are turned on to discharge match line M to ground. Conversely, when a match condition occurs, match line M remains in its precharged state (i.e., no signal path is formed by transistors L1 and L3, or transistors L2 and L4).

Figure 5:
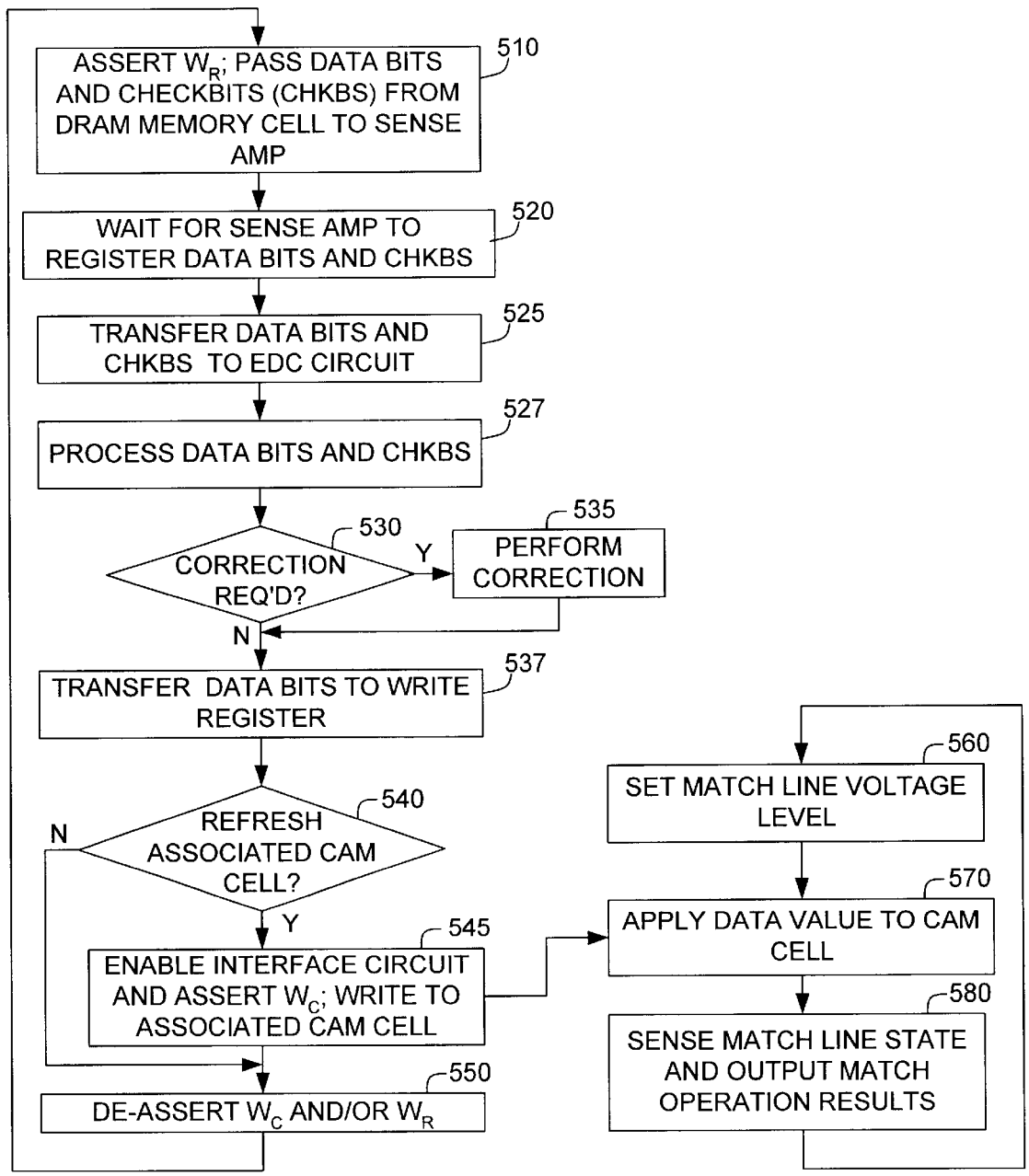
FIG. 5 is a flow diagram showing refresh and match operations that are simultaneously performed by the binary CAM device of FIG. 4.

FIG. 5 is a flow diagram showing general steps associated with match and refresh operations of CAM device 100A according to one specific embodiment. The steps shown in the left column of FIG. 5 are associated with a refresh operation performed by DRAM array 110A and EDC circuit 150, and the steps shown in the right side of FIG. 5 are associated with a lookup operation that performed by SRAM CAM array 120A.

Referring to the left side of FIG. 5 and to the circuit shown in FIG. 4, the refresh operation begins by accessing a selected data word (e.g., the data word partially stored in DRAM memory cells 115-A1 and 115-A2) and its associated checkbit word in DRAM memory array 110A by asserting word line $W_R$-1 coupled to transistors T1 of selected DRAM memory cells 115-A1, 115-A2, 117-A1, and 117-A2 (Block 510 in FIG. 5). The thus turned-on transistors T1 pass respective data values from selected DRAM memory cells 115-A1 and 115-A2 onto bit lines $B_R$-1 and $B_R$-2, and respective checkbit values from selected DRAM memory cells 117-A1 and 117-A2 onto bit lines $B_R$-3 and $B_R$-4. Note that, in an actual implementation, asserted word line $W_R$-1 also connects other DRAM memory cells (not shown) in the row including the selected data word/checkbit word to their associated bit lines, which are also registered by associated sense amplifiers.

Next, a predetermined time is allowed for sense amplifier 410 to sense and register the data value transmitted on bit lines $B_R$-1 through $B_R$-4 of RAM array 110A (Block 520), thereby refreshing DRAM cells 115-A1, 115-A2, 117-A1 and 117-A2. For example, when sense amplifier 410 senses a logic "1" on bit line $B_R$-1 (which is typically less than VCC due to signal degradation), sense amplifier 410 registers this data value by transmitting a refreshed logic "1" (e.g., VCC) onto bit line $B_R$-1, which is passed by transistor T1 to node n1 of DRAM cell 115-A1. Conversely, when sense amplifier 410 senses a logic "0" on bit line $B_R$-1 (which is typically greater than ground/zero volts), sense amplifier 410 registers this data value by transmitting a refreshed logic "0" (e.g., ground or zero volts) onto bit line B1, which is passed by transistor T1 to node n1. Note that word line $W_R$-1 remains turned on while sense amplifier 410 registers the data value, thereby causing the amplified data values to be written back into selected DRAM memory cells 115-A1, 115-A2, 117-A1, and 117-A2.

The data word and associated checkbit word registered in sense amplifier circuit 410 is then transferred to EDC circuit 150 (block 525), where the data word is compared with the previously stored checkbits word by converting (e.g., encrypting) the data word to form a new checkbit word, and then comparing the new checkbit word with the previously stored checkbit word in the manner described above (block 527). Next, if correction is necessary (block 530), the data word is corrected in the manner described above (block 535), and then the corrected data word is transferred to write register 430 (block 537).

The control circuit then determines whether the CAM cell 125A associated with memory cell 115A is scheduled for refresh (Block 540). In one embodiment, CAM cells of CAM array 120A that do not store meaningful data (e.g., the section of CAM array 120A is currently not being used to store data values) are not refreshed, so control is passed directly to Block 550. The determination of whether meaningful data is stored or not is performed by the control circuit. In another embodiment, a refresh operation may be omitted for other reasons (e.g., scheduling data write operations). In yet another embodiment, all of the CAM cells of CAM array 120A are refreshed during each refresh cycle, whether they stored meaningful data or not, so the result in Block 540 is always Yes (i.e., control is always passed to Block 545).

If associated CAM cells 125-A1 and 125-A2 are scheduled for refresh (i.e., if control is passed to Block 545), then interface circuit 140A is enabled to pass the data value read from DRAM cell 115A to bit lines B and B# of CAM array 120A using known techniques, and word line $W_c$-1 is enabled. Enabling word line $W_c$-1 turns on transistors S1 and S2 of each CAM cell 125-A1 and 125-A2, which pass the data value and its inverse to storage node a and inverted storage node b, respectively. Accordingly, if the data values stored in either SRAM CAM cells 125-A1 or 125-A2 is erroneously flipped due to, for example, an alpha-particle strike, then the refresh operation corrects the erroneous data value. Conversely, if the data values stored in SRAM CAM cells 125-A1 and 125-A2 are correct, then the refresh operation does not change the stored data value.

Finally, after a predetermined set-up period, word line $W_R$-1 (and word line $W_c$-1, if asserted) are de-asserted, thereby turning off transistors T1 (and S1 and S2, if turned on) to isolate storage nodes of the associated memory cells from their respective bit lines (Block 550).

Referring to the right column in FIG. 5, while the refresh operation is repeatedly performed, lookup operations are also performed using applied data values transmitted to binary DRAM CAM cell 125-A1 on data lines D and D#. First, match line M and low match line LM are pre-charged in the manner described above (Block 560). Next, an applied data value (and its inverse) is transmitted on data line D (and inverted data line D#) (Block 570). A no-match condition is detected when a signal path is opened between match line M and the low match line LM. In particular, when the applied data value transmitted on inverted data line D# and the data value at storage node a are both logic "1" (i.e., high) data values, then match line M is discharged through the turned-on pass transistors L1 and L3, thereby indicating a no-match condition on match line M. Similarly, a no-match condition is also detected when the applied data value on data line D and the inverted data value stored at inverted storage node b are both high, thereby discharging match line M through the turned-on pass transistors L2 and L4. Finally, the charged/discharged state of match line M is sensed by match line control circuit 123 (see FIG. 1) (Block 580), and the results of the match operation are output through function control circuit 124 (see FIG. 1).

The above refresh operation is repeated in accordance with known techniques in order to refresh DRAM array 110A, and to selectively refresh SRAM CAM array 120A. In addition, lookup operation described with reference to Blocks 560-580 is performed simultaneously with the refresh operation, thereby providing an efficient CAM device that is not delayed by refresh operations before performing logic operations.

The present invention is not necessarily limited to the specific RAM and CAM circuitry of CAM device 100A (shown in FIG. 4). For example, CAM devices, such as that described below with reference to FIG. 6, may include CAM arrays utilizing logic circuits other than those shown in FIG. 4 to perform lookup functions. Further, as described below with reference to FIGS. 7 through 9, CAM devices may be formed in accordance with the present invention using CAM arrays and RAM arrays based on other memory types. Further, as described below with reference to FIGS. 10 and 11, ternary CAM devices and quad CAM devices may be formed in accordance with the present invention. Note that each of these embodiments incorporates EDC circuit 150, which operates in the manner described above. These additional embodiments are intended to be exemplary and not limiting.

Figure 6:
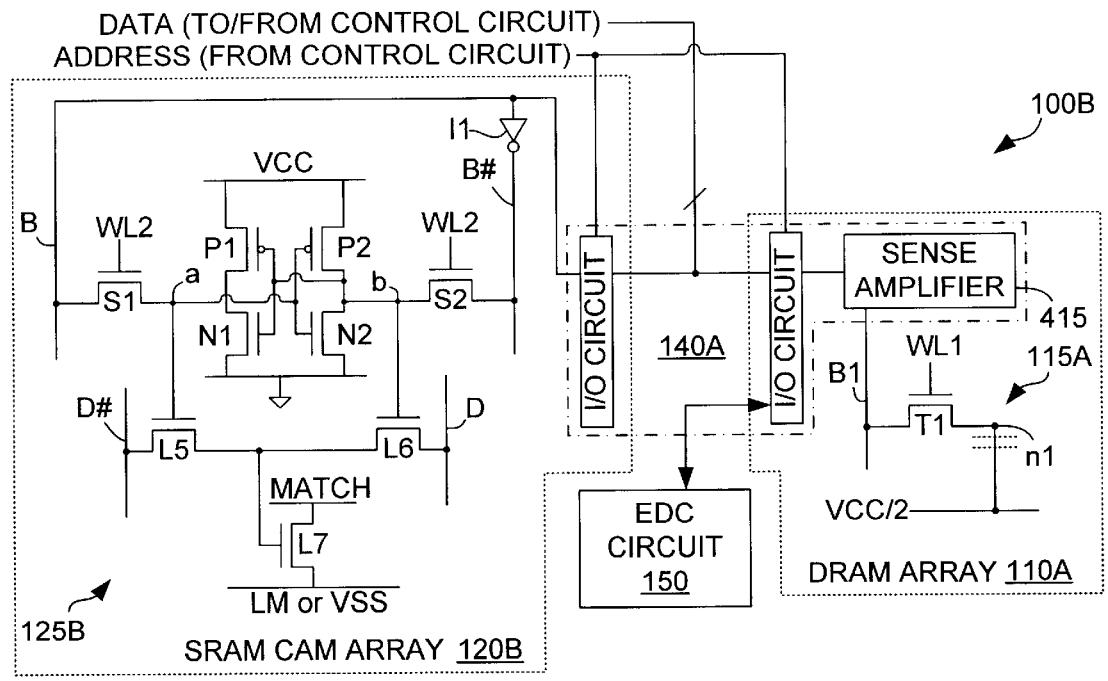
FIG. 6 is a simplified schematic diagram showing a portion of a binary CAM device according to a second specific embodiment of the present invention.

FIG. 6 is a simplified schematic diagram showing a portion of a binary CAM device 100B including DRAM 110A, which is described above with reference to FIG. 4, and an SRAM-based CAM array 120B. In addition, SRAM-based CAM array 120B includes a bistable flipflop, which is formed by transistors P1, P2, N1, and N2, that is connected to bitlines B and B# by access transistors S1 and S2. CAM array 100B also includes an interface circuit 140A that is essentially identical to that described above with reference to FIG. 4. Because these circuits are described in detail above, description of these circuits is omitted here for brevity.

Referring to the lower left portion of FIG. 6, SRAM-based CAM array 120B differs from CAM array 120A in that it includes a three-transistor logic circuit is formed by transistors L5, L6, and L7, instead of the four-transistor logic circuit shown in FIG. 4. In particular, transistor L5 has a gate terminal connected to node a, a first terminal connected to inverted data line D#, and a second terminal connected to a gate terminal of transistor L7. Similarly, transistor L6 has a gate terminal connected to node b, a first terminal connected to data line D, and a second terminal connected to a gate terminal of transistor L7. Transistor L7 is connected between match line M and low match line LM (or VSS). During lookup operations, match line M indicates match or no-match conditions similar to that described above with reference to FIG. 4. For example, a high voltage at node a turns on transistor L5, thereby passing the inverted data bit on inverted data line D# to the gate terminal of transistor L7. If this inverted data bit is also high, then transistor L7 is turned on and match line M is discharged, thereby indicated a no-match condition. Similarly, a high voltage at node b turns on transistor L6, thereby passing the data bit on data line D to the gate terminal of transistor L7. If the true data bit is also high, then transistor L7 is turned on and match line M is discharged, thereby indicated a no-match condition. Because the lookup operation is performed using only three transistors (instead of four), each CAM cell 125B may be formed using less area than CAM cells 125A (FIG. 4), thereby reducing the size of CAM array 120B.

Figure 7:
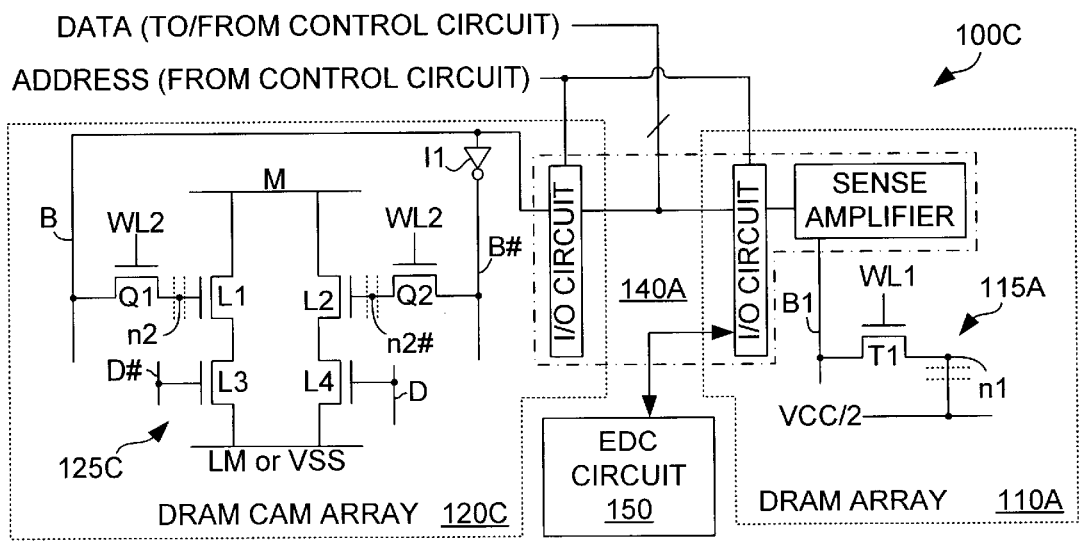
FIG. 7 is a simplified schematic diagram showing a portion of a binary CAM device according to a third specific embodiment of the present invention.

FIG. 7 is a simplified schematic diagram showing a portion of a binary CAM device 100C including DRAM 110A, which is described above with reference to FIG. 4, and a DRAM-based CAM array 120C. DRAM-based CAM array 120C includes a logic circuit formed by transistors L1 through L4 that operates in essentially the same manner as the logic circuit described above with reference to FIG. 4. However, DRAM-based CAM array 120C differs from the embodiment shown in FIG. 4 in that DRAM-based CAM cells 125C (one shown) store data values at nodes n2 and n2#, which have respective intrinsic capacitances formed in accordance with known DRAM techniques. In particular, a data value written on bit line B is passed to node n2 by turning on access transistor Q1, where it remains stored for a period of time. Similarly, an inverted data value written on bit line B# is passed to node n2# by turning on access transistor Q2. The data values stored at nodes n2 and n2# are compared with data values transmitted on data lines D and D# in the manner described above. A disadvantage of binary CAM device 100C is that CAM array 120C may require additional I/O terminals to support refresh operations originating in DRAM array 110A. However, a corresponding advantage provided by binary CAM device 100C is that, because CAM cells 125C are refreshed each cycle by corresponding DRAM cells 115A, binary CAM array 120C may be simplified by omitting an independent refresh circuit. Further, DRAM array 110A may be formed using higher voltage/higher capacitance DRAM cells to prevent soft errors, while DRAM CAM array 120C may be formed using low voltage DRAM cells to minimize power consumption.

Figure 8:
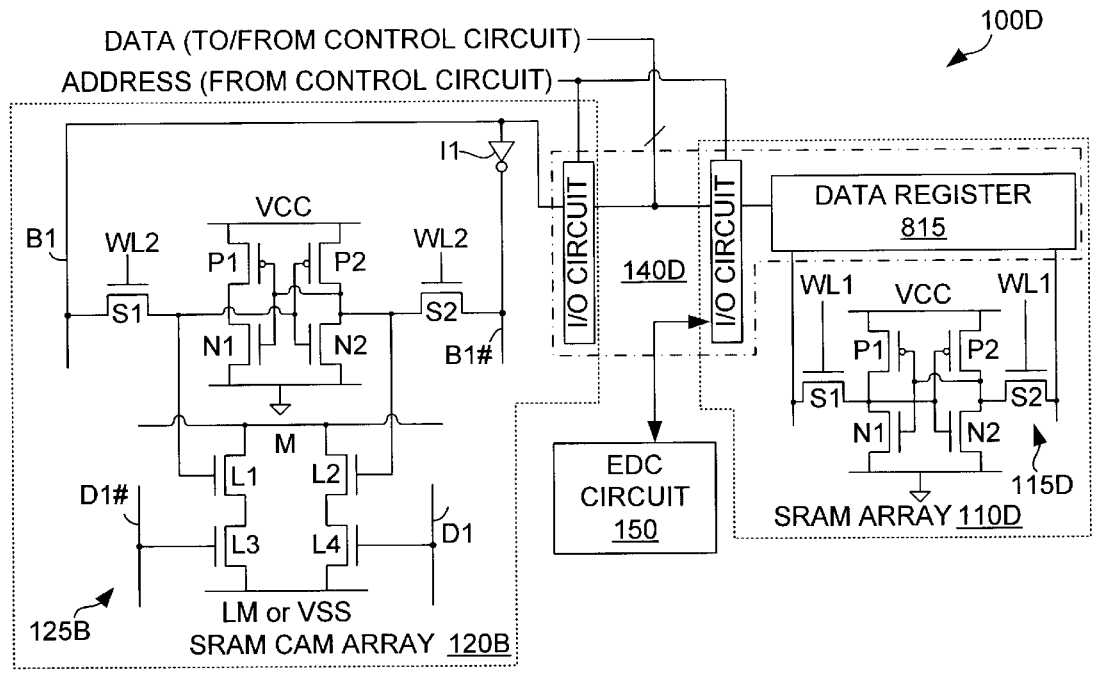
FIG. 8 is a simplified schematic diagram showing a portion of a binary CAM device according to a fourth specific embodiment of the present invention.

FIG. 8 is a simplified schematic diagram showing yet another binary CAM device 100D including SRAM-based CAM array 120B, which is described above with reference to FIG. 5, and an SRAM array 110D, which includes a series of SRAM cells 115D (one shown) arranged in rows and columns. An interface circuit 140D includes a data register 815 for reading data values from SRAM cells 115D, and I/O circuits similar to those described above. SRAM array 110D has an advantage over DRAM array 110A (described above) in that SRAM cells 115D do not require periodic refreshing, thereby allowing more flexibility in refreshing CAM array 120B. CAM device 110D may be more expensive than the DRAM-based circuits discussed above, but SRAM arrays are typically faster than DRAM arrays (discussed above), thereby allowing more frequent refreshing of CAM array 120B.

Figure 9:
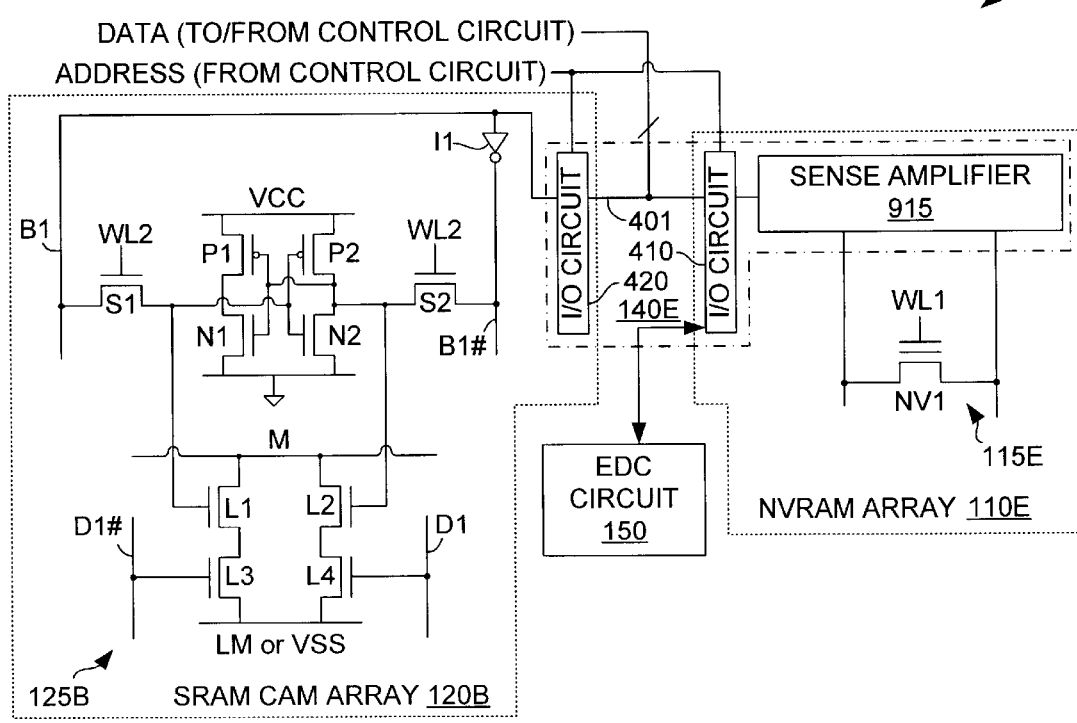
FIG. 9 is a simplified schematic diagram showing a portion of a binary CAM device according to a fifth specific embodiment of the present invention.

FIG. 9 is a simplified schematic diagram showing yet another binary CAM device 100E including SRAM-based CAM array 120B, which is described above with reference to FIG. 5, and an NVRAM array 110E, which includes a series of floating gate NVRAM cells 115E (one shown)

arranged in rows and columns. An interface circuit 140E includes a data register 915 for reading data values from NVRAM cells 115E, and I/O circuits similar to those described above NVRAM array 110E has an advantage over DRAM array 110A and SRAM array 110D (described above) in that NVRAM cells 115E maintain data values if system power is interrupted, thereby facilitating convenient and rapid recovery of CAM system 100E. In addition, NVRAM cells are typically smaller than SRAM cells. However, NVRAM cells typically take longer to write than SRAM or DRAM cells, so the use of CAM device 100E may be limited to systems requiring infrequent updating, such as inventory applications where data is updated once a day.

The present invention also extends to ternary and quad CAM devices, as exemplified by the embodiments described below with reference to FIGS. 10 and 11. Although the following embodiments are SRAM-based, it is understood that these embodiments may also be constructed using the various technologies described above.

Figure 10:
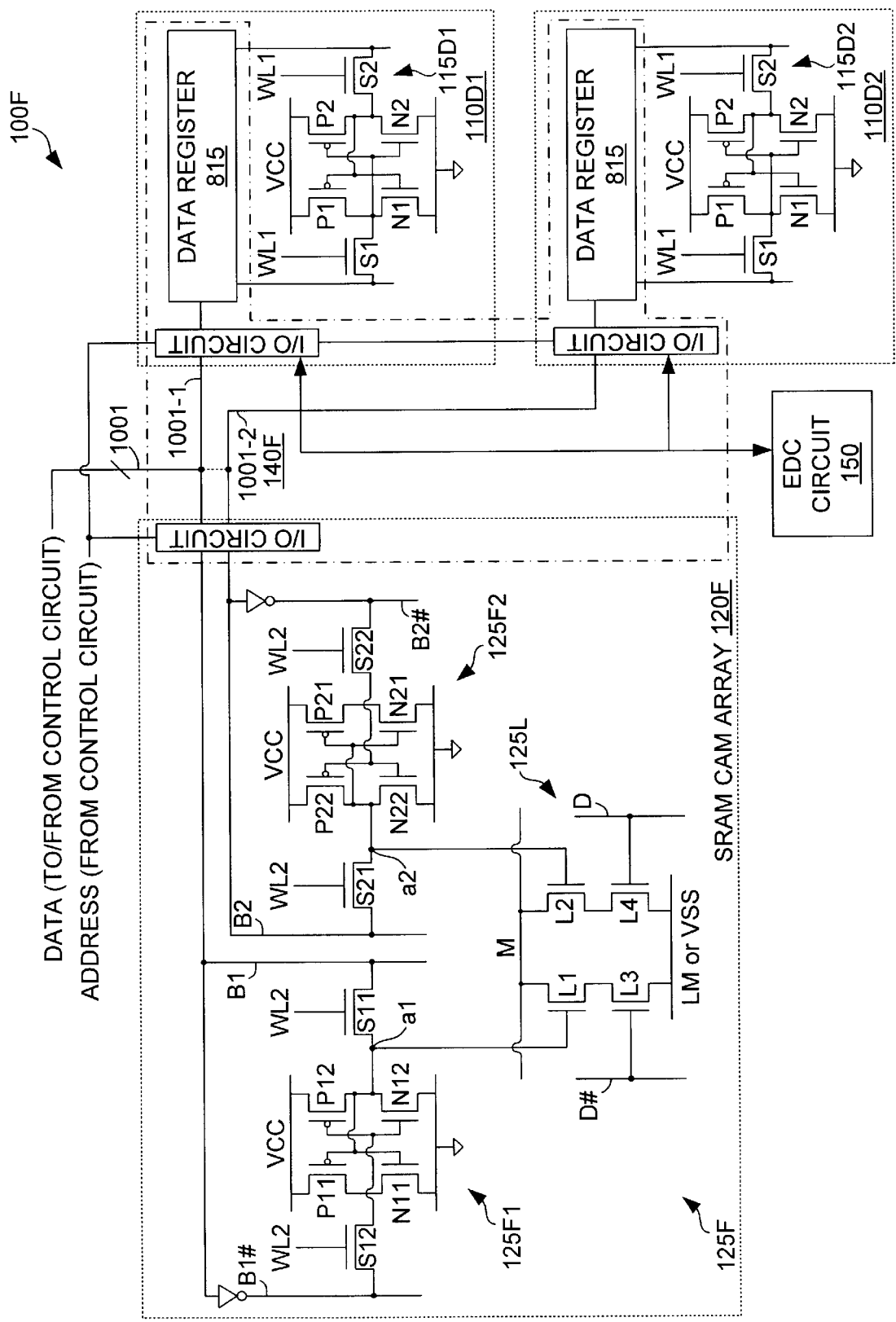
FIG. 10 is a simplified schematic diagram showing a portion of a ternary CAM device according to a sixth specific embodiment of the present invention.

FIG. 10 is a simplified circuit diagram showing portions of a ternary CAM device 100F in accordance with a sixth specific embodiment of the present invention. Ternary CAM device 100F includes a first SRAM array 110D1, a second SRAM array 110D2, and a ternary SRAM CAM array 120F, which are connected to a control circuit (not shown) by a bus 1001. An interface circuit 140F is formed by two data registers 815 and I/O circuits, one each per SRAM array 110D1 and 110D2, and an I/O circuit provided in CAM array 120F, which operate in a manner similar to the embodiments described above.

Referring to the right side of FIG. 10, each SRAM array 110D1 and 110D2 includes an array of conventional SRAM memory cells 115D (one shown) that are arranged in rows and columns (as shown in FIG. 2), and operate in the manner described above with reference to FIG. 8. SRAM array 110D1 transmits data values on a first set of bus lines 1001-1 (one shown) of bus 1001, and SRAM array 110D2 transmits data values on a second set of bus lines 1001-2 (one shown) of bus 1001. Accordingly, during a single refresh cycle, CAM array 120F receives a first data value transmitted from SRAM cell 115D1 and a second data value transmitted from SRAM cell 115D2, as described below.

Referring to the left portion of FIG. 10, ternary CAM array 120F includes an array of SRAM CAM cells 125F (one shown) that are arranged in rows and columns. Each SRAM CAM cell 125F includes a first SRAM cell 125F1, a second SRAM cell 125F2, and a logic circuit 125L. First SRAM cell 125F1 includes a bistable flipflop formed by transistors P11, P12, N11 and N12, and is connected to bit lines B1 and B1# by access transistors S11 and S12, respectively. A first data value received from bus line 1001-1 is passed on bit line B1 to first SRAM cell 125F1, and is stored at a node a1. Second SRAM cell 125F2 includes a bistable flipflop formed by transistors P21, P22, N21 and N22, and is connected to bit lines B2 and B2# by access transistors S21 and S22, respectively. A second data value received from bus line 1001-2 is passed on bit line B2 to second SRAM cell 125F2, and is stored at node a2. Logic circuit 125L includes transistors L1 through L4 that operate in the manner described above. However, instead of being controlled by a single SRAM cell, as in the bistable embodiments described above, node a1 of SRAM cell 125F1 is connected to the gate terminal of transistor L1, and node a2 of SRAM cell 125F2 is connected to the gate terminal of transistor L2.

Operation of ternary CAM device 100F is similar to that described above with reference to the various binary CAM devices in that each CAM cell 125F is refreshed during a write phase of a refresh operation using the two data values read from associated SRAM memory cells 115D1 and 115D2 during a read phase of the refresh operation. In particular, to refresh CAM cell 125F, data values are read from associated SRAM memory cells 115D1 and 115D2, and passed to interface circuit 140F by enabling word line WL1. After registering the respective data values and passing the data values to bit lines B1 and B2 of CAM array 120F, word line WL2 is turned on, thereby passing the data values to storage nodes a1 and a2, respectively. After predetermined set-up periods, word lines WL1 and WL2 are disabled, thereby isolating SRAM cells 115D1, 115D2, 125F1 and 125F2 from their respective bit lines.

While the above-described refresh operation is systematically performed, lookup operations are also performed using applied data values transmitted to ternary CAM cell 125F on data lines D and D#. With match line M and the low match line LM pre-charged in the manner described above, an applied data value (and its inverse) is transmitted on data line D (and inverted data line D#). The lookup operation performed by ternary CAM cell 125F differs from that of binary CAM cells (described above) in that the two data values stored in SRAM cells 115D1 and 115D2 facilitate a "don't care" lookup operation in CAM cell 125F. As described above, binary CAM cells, such as that described above with reference to FIG. 4, store a logic "1" (high voltage) value in at least one of the storage nodes n2 and n2#, so one of transistors L1 and L2 is always turned on during a lookup operation. Ternary CAM cell 125F operates in a similar manner to store logic "1" (e.g., 1,0) and logic "0" (e.g., 0,1) data values, but is also capable of storing a "don't care" value in which both storage nodes a1 and a2 store logic "0". Specifically, when CAM cell 125F stores either a logic "1" data value or a logic "0" data value, at least one of storage nodes a1 and a2 are held at a high voltage level during the match operation, thereby opening one of transistors L1 and L2, and allowing match line M to discharge to low match line LM when the applied data value turns on a corresponding transistor L3 or L4. However, when a "don't care" logic value is transmitted to CAM cell 125F during the refresh operation, both storage nodes a1 and a2 are maintained at low voltage (e.g., ground) levels, thereby preventing the discharge of match line M irrespective of the applied data value. Subsequent operation of CAM array 120F is similar to that described above.

Figure 11:
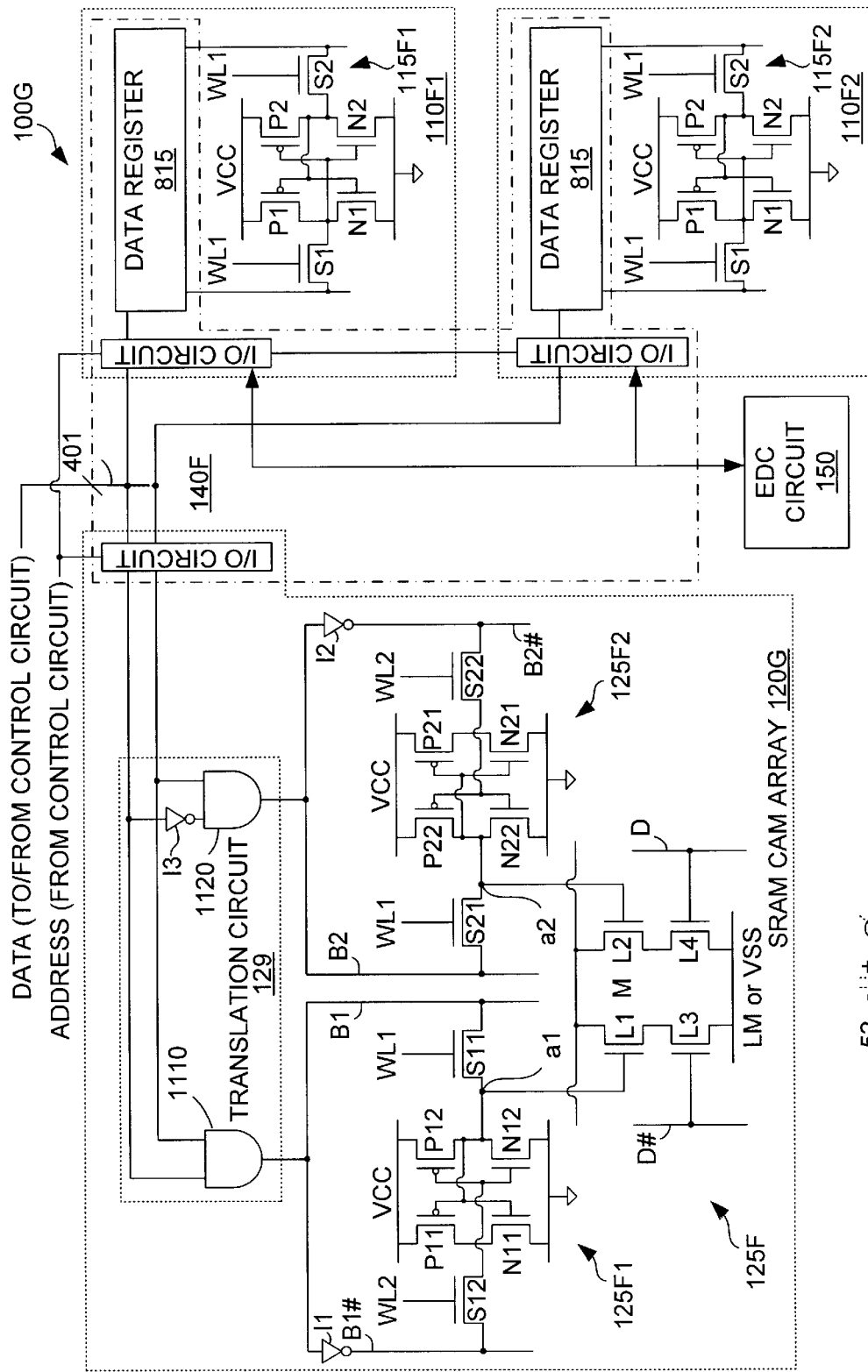
FIG. 11 is a simplified schematic diagram showing a portion of a quad CAM device according to a seventh specific embodiment of the present invention.
Figure 12:
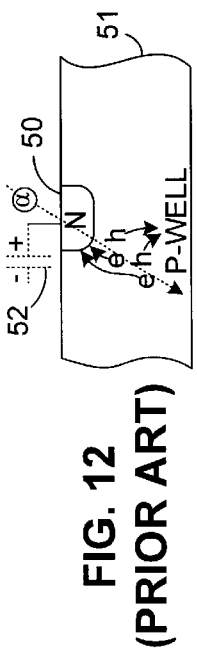
FIG. 12 is simplified cross sectional view showing a node of an IC device.

FIG. 11 is a simplified circuit diagram showing portions of a quad (i.e., four state) CAM device 100G in accordance with a seventh specific embodiment of the present invention. Quad CAM device 100G includes SRAM arrays 110D1 and 110D2, which are described above with reference to ternary CAM device 100F (shown in FIG. 10), and a quad CAM array 120G. Quad CAM array 120G includes an array of quad CAM cells 120F, also described above with reference to FIG. 10, and a translation circuit 129 for translating the data values read from SRAM arrays 110D1 and 110D2 to support quad CAM cell operations in the manner described below. As in previous examples, portions of CAM device 100G that are not required for explanatory purposes are omitted for brevity.

In general, quad CAM cells differ from ternary CAM cells in that ternary CAM cells store don't care (e.g., 0,0) data values, whereas quad CAM cells store logic low don't care data values (e.g., 0,0) and logic high don't care data values (e.g., 1,1). These distinct don't care values allow a quad CAM cell to retain a logic value (logic "1" or logic "0") even though it is designated as "don't care" during lookup operations. For example, referring to CAM cell 125F, a logic high value (e.g., 1,0) stored at nodes a1 and a2 will turn on transistor L1 (transistor L2 remains turned off). If a subsequent logic low data value (e.g., 0,1) is transmitted on data line D and inverted data line D#, then transistor L3 is turned on, discharging match line M through transistors L1 and L3. When a don't care logic value is stored in CAM cell 125F, both transistors L1 and L2 remain turned off, thereby precluding a no-match condition. However, in quad CAM cells, if the logic high don't care data values (1,1) is written into CAM cell 125F, then both transistors L1 and L2 would be turned on, thereby generating a no-match condition no matter what data value is applied to data lines D and D#.

Translation circuit 127 is provided to avoid the problem associated with storing a logic high don't care data values (1,1) in CAM cell 125F. Specifically, translation circuit 129 includes a first AND gate 1110, a second AND gate 1120, and an inverter I3 that are connected to bit lines B1 and B2 to translate the data values, which are read from SRAM cells 115D1 and 115D2, into data values stored at storage nodes a1 and a2 of SRAM cells 125F1 and 125F2 according to Table 1, provided below.

TABLE 1

| 115D1 | 115D2 | 125F1 | 125F2 |
|-------|-------|-------|-------|
| 0     | 0     | 0     | 0     |
| 1     | 0     | 0     | 0     |
| 1     | 1     | 1     | 0     |
| 0     | 1     | 0     | 1     |

According to the translations provided in Table 1, each time a logic high don't care (1,0) or a logic low (0,0) don't care data value is written to CAM cell 125F, translation circuit 129 converts these data values into don't are (0,0) data value, thereby preventing a no-match condition during the subsequent application of a data value on data lines D and D#. Note that when the logic high don't care or logic low don't care data value is required, this data value is read from SRAM cells 115F1 and 115F2 using known techniques. Those of ordinary skill in the art will recognize that the logic performed by translation circuit 129 can be implemented using other types of logic gates and other data values stored in SRAM cells 115F1 and 115F2. Accordingly, the circuit structure shown in FIG. 11 is merely exemplary, and is not intended to be limiting.

Although the present invention is described with reference to two DRAM arrays formed on a single "chip", the two DRAM arrays (e.g., first DRAM array 110 and second DRAM array 120) can be fabricated separately and then combined using multi-chip module (MCM) packaging.

Further, although the present invention is described with reference to a modified Hamming code error control scheme in which errors are detected by comparing stored check bits with check bits generated during the refresh operation, the present invention is applicable to other error control schemes as well. For example, the present invention may be used with the forward error control (FEC) and automatic repeat request error control schemes as set forth in F. Halsall, Data Communications, Computer Networks and OSI, 2d. ed., pp. 499–508, Addison-Wesley Publ. Co. (1988), which is incorporated herein by reference. One such FEC scheme utilizes a Hamming single-bit code in which check bits may be interspersed with the associated data bits (e.g., a so-called "11,7 block code"). After reading the block code (i.e., both the data bits and the check bits) from the PAM, processing is performed by converting the data bits and associated check bits into binary numbers, and identifying errors by adding together the binary numbers using modulo 2 arithmetic. Under this scheme, the bit position of the erroneous data bit (or check bit) is identified by the sum of the modulo 2 arithmetic. Correction is then performed, if necessary, by inverting the bit whose position is identified by the modulo 2 arithmetic. The data bits can then be written to the CAM array.

In yet another alternative embodiment of the present invention, data is encoded, for example, using a convolution code before being stored in the RAM array(s). In such embodiments, the encoded data is processed by the EDC circuit in a manner that involves decoding the encoded data, detecting errors in the decoded data, correcting the detected errors according to known techniques that are also discussed in Data Communications, Computer Networks and OSI (cited above).

In yet another alternative embodiment of the present invention, an automatic repeat request (ARQ) error control scheme may be utilized in which, when an error is detected, the refresh operation is temporarily halted, and a request for a copy of the data word is generated and transmitted from the CAM circuit to an external control circuit (e.g., a computer). ARQ error control schemes may utilize any of several error detection methods, such as vertical redundancy check (VRC), longitudinal redundancy check (LRC), and cyclic redundancy check (CRC), or checksum methods. In such instances, when errors are detected, an error message is generated by the ERC circuit that is transmitted to the external control circuit. The external control circuit then responds to the request by transmitting the data word copy to the CAM circuit. The data word copy then replaces the erroneous data word, and the refresh operation is resumed. This request process may also be used in conjunction with the embodiments mentioned above when multi-bit errors are detected.

In view of these and other possible modifications, the invention is limited only by the following claims.

What is claimed is:

1. A content addressable memory (CAM) circuit comprising:
   a random access memory (RAM) array including a first plurality of RAM cells for storing data bits, and a second plurality of RAM cells for storing an associated first set of check bits;
   a CAM array including a plurality of CAM cells; and
   means coupled to the RAM array and the CAM array for systematically refreshing the CAM array by reading the data bits and first set of check bits from the RAM array, processing the data bits and first set of check bits to detect errors in the data bits, and then writing the data bits to the plurality of CAM cells.

2. The CAM circuit according to claim 1, wherein said means further comprises a checkbit generation circuit for generating the associated first set of check bits by encrypting the data bits before the data bits are stored in the first plurality of RAM cells.

3. The CAM circuit according to claim 1, wherein said means comprises a checkbit generation circuit for generating a second set of check bits by encrypting the data bits read from the RAM array, and means for detecting an error in the data bits by comparing the second set of check bits with the first set of check bits.

4. The CAM circuit according to claim 3, further comprising means for correcting the data bits if the first set of check bits fails to match the second set of check bits.

5. The CAM circuit according to claim 1, wherein said means comprise means for converting the data bits and associated check bits into binary numbers, and identifying errors by adding together the binary numbers using modulo 2 arithmetic.

6. The CAM circuit according to claim 5, wherein said means further comprises means for correcting the data bits by inverting a bit identified by a sum of the modulo 2 arithmetic.

7. The CAM circuit according to claim 1, wherein said means further comprises means for requesting a copy of the data bits when an error is detected.

8. A content addressable memory (CAM) circuit comprising:

a random access memory (RAM) array including a plurality of RAM cells for storing a plurality of encoded data bits;

a CAM array including a plurality of CAM cells; and means coupled to the RAM array and the CAM array for refreshing the CAM array by reading the encoded data bits from the RAM array, decoding the encoded data bits, detecting errors in the decoded data bits, and then writing the decoded data bits to the plurality of CAM cells.

9. The CAM circuit according to claim 8, wherein the encoded data bits comprise a convolutional code, and the means for decoding the encoded data bits comprises a logic circuit for performing a predetermined binary operation on the encoded data bits to produce the decoded data bits.

10. The CAM circuit according to claim 8, wherein said means further comprises means for requesting a copy of the data bits when an error is detected.

11. A method for operating a content addressable memory (CAM) circuit including a random access memory (RAM) array including a first plurality of memory cells and a second plurality of memory cells, and a CAM array including a plurality of CAM cells, each CAM cell including a third memory cell, the method comprising:

storing data bits in the first plurality of memory cells of the RAM array and associated check bits in the second plurality of memory cells; and systematically refreshing the CAM array by reading the data bits from the first plurality of memory cells and the associated check bits from the second plurality of memory cells, detecting errors in the data bits using the associated check bits, and then writing the data bits to the third memory cells.

12. The method according to claim 11, further comprising generating the associated check bits by encrypting the data bits before the data bits are written to the first plurality of memory cells.

13. The method according to claim 12, wherein systematically refreshing the CAM array further comprises generating a second set of check bits by re-encrypting the data bits read from the RAM array, and wherein detecting errors in the data bits comprises comparing the second set of check bits with the check bits read from the second plurality of memory cells.

14. The method according to claim 13, further comprising correcting the data bits if the check bits read from the second plurality of memory cells fail to match the second set of check bits.

15. The method according to claim 11, wherein detecting errors comprises converting the data bits and associated check bits into binary numbers, and identifying errors by adding together the binary numbers using modulo 2 arithmetic.

16. The method according to claim 15, wherein correcting the data bits comprises inverting a bit identified by a sum of the modulo 2 arithmetic.

17. The method according to claim 11, further comprising requesting a copy of the data bits from an external system when an error in the data bits is detected.

18. A method for operating a content addressable memory (CAM) circuit including a random access memory (RAM) array including a plurality of first memory cells, and a CAM array including a plurality of CAM cells, each CAM cell including a second memory cell, the method comprising:

storing encoded data bits in the plurality of first memory cells of the RAM array; and systematically refreshing the CAM array by reading the encoded data bits from the plurality of first memory cells, decoding the encoded data bits, detecting and correcting errors in the decoded data bits, and then writing the data bits to the second memory cells.

19. The method according to claim 18, wherein the encoded data bits comprise a convolutional code, and wherein decoding the encoded data bits comprises performing a predetermined binary operation on the encoded data bits to produce the decoded data bits.

20. The method according to claim 18, further comprising requesting a copy of the data bits from an external system when an error in the data bits is detected.

* * * * *